(12) United States Patent
Vainshtain et al.

(10) Patent No.: US 11,663,680 B2
(45) Date of Patent: May 30, 2023

(54) METHOD AND SYSTEM FOR AUTOMATIC WORK INSTRUCTION CREATION

(71) Applicant: SIEMENS INDUSTRY SOFTWARE LTD., Tel Aviv (IL)

(72) Inventors: Victor Michael Vainshtain, Natanya (IL); Eran Nadel, Kfar Saba (IL); Nir Sagi, Ramat Gan (IL)

(73) Assignee: Siemens Industry Software Ltd, Tel Aviv (IL)

( * ) Notice: Subject to any disclaimer, the term of this patent is extended or adjusted under 35 U.S.C. 154(b) by 214 days.

(21) Appl. No.: 16/978,432

(22) PCT Filed: Mar. 7, 2018

(86) PCT No.: PCT/IB2018/000240
§ 371 (c)(1),
(2) Date: Sep. 4, 2020

(87) PCT Pub. No.: WO2019/171094
PCT Pub. Date: Sep. 12, 2019

(65) Prior Publication Data
US 2021/0048805 A1 Feb. 18, 2021

(51) Int. Cl.
*G06Q 50/04* (2012.01)
*G05B 19/418* (2006.01)
(Continued)

(52) U.S. Cl.
CPC ......... *G06Q 50/04* (2013.01); *G05B 19/4183* (2013.01); *G05B 19/4188* (2013.01);
(Continued)

(58) Field of Classification Search
CPC .... G06Q 50/04; G06Q 10/0631; G06F 30/20; G05B 19/41805; G05B 19/4183; G05B 19/4188; G05B 19/41885
See application file for complete search history.

(56) References Cited

U.S. PATENT DOCUMENTS

| | | |
|---|---|---|
| 2007/0061049 A1 | 3/2007 | Masuda et al. |
| 2014/0200706 A1 | 7/2014 | Pruschek et al. |

(Continued)

OTHER PUBLICATIONS

Geng J, Zhang S, Yang B. A publishing method of lightweight three-dimensional assembly instruction for complex products. Journal of Computing and Information Science in Engineering. Sep. 1, 2015;15(3). (Year: 2015).*

(Continued)

*Primary Examiner* — Chuen-Meei Gan
(74) *Attorney, Agent, or Firm* — Laurence A. Greenberg; Werner H. Stemer; Ralph E. Locher

(57) ABSTRACT

A method for automatically creating electronic work instructions includes receiving a simulation data structure enabling a simulation of a production process of a product including simulation data and production process information, and automatically collecting, for each step of the production process, step related production process information and temporally tagging the production process information collected for each step in order to create, for each step and from the production process information, an electronic work instruction including temporal data enabling a temporal synchronization of a display of the electronic work instruction with a display of the simulation result. A data processing system and a non-transitory computer-readable medium are also provided.

11 Claims, 4 Drawing Sheets

(51) Int. Cl.
*G06F 30/20* (2020.01)
*G06Q 10/0631* (2023.01)

(52) U.S. Cl.
CPC . *G05B 19/41805* (2013.01); *G05B 19/41885* (2013.01); *G06F 30/20* (2020.01); *G06Q 10/0631* (2013.01)

(56) References Cited

U.S. PATENT DOCUMENTS

2017/0075347 A1    3/2017  Smith et al.
2019/0302751 A1*  10/2019  Aikens ............. G05B 19/41875

OTHER PUBLICATIONS

Belusko M, Hegedus M, Fedorko G. Creating Visual Work Instructions to Ensure Safe and Fluent Operation of the Semi-automatic Production Lines. Open Engineering. Dec. 30, 2016;6(1). (Year: 2016).*
Holt, Erika et al.: "Augmented Assembly—Increasing efficiency work with Augmented Reality", YouTube, Mar. 9, 2010 (Mar. 9, 2010) p. 1, XP055832104, Retrieved from the Internet URL: https://www.youtube.com/watch?v=vOhiZ37aaww [retrieved on Aug. 16, 2021].
Niedersteiner, Sascha et al.: "Smart Workbench: A Multimodal and Bidirectional Assistance System for Industrial Application", IECON 2015—41st Annual Conference of the IEEE Industrial Electronics Society, IEEE, Nov. 9, 2015 (Nov. 9, 2015), pp. 2938-2943, XP032855693.

* cited by examiner

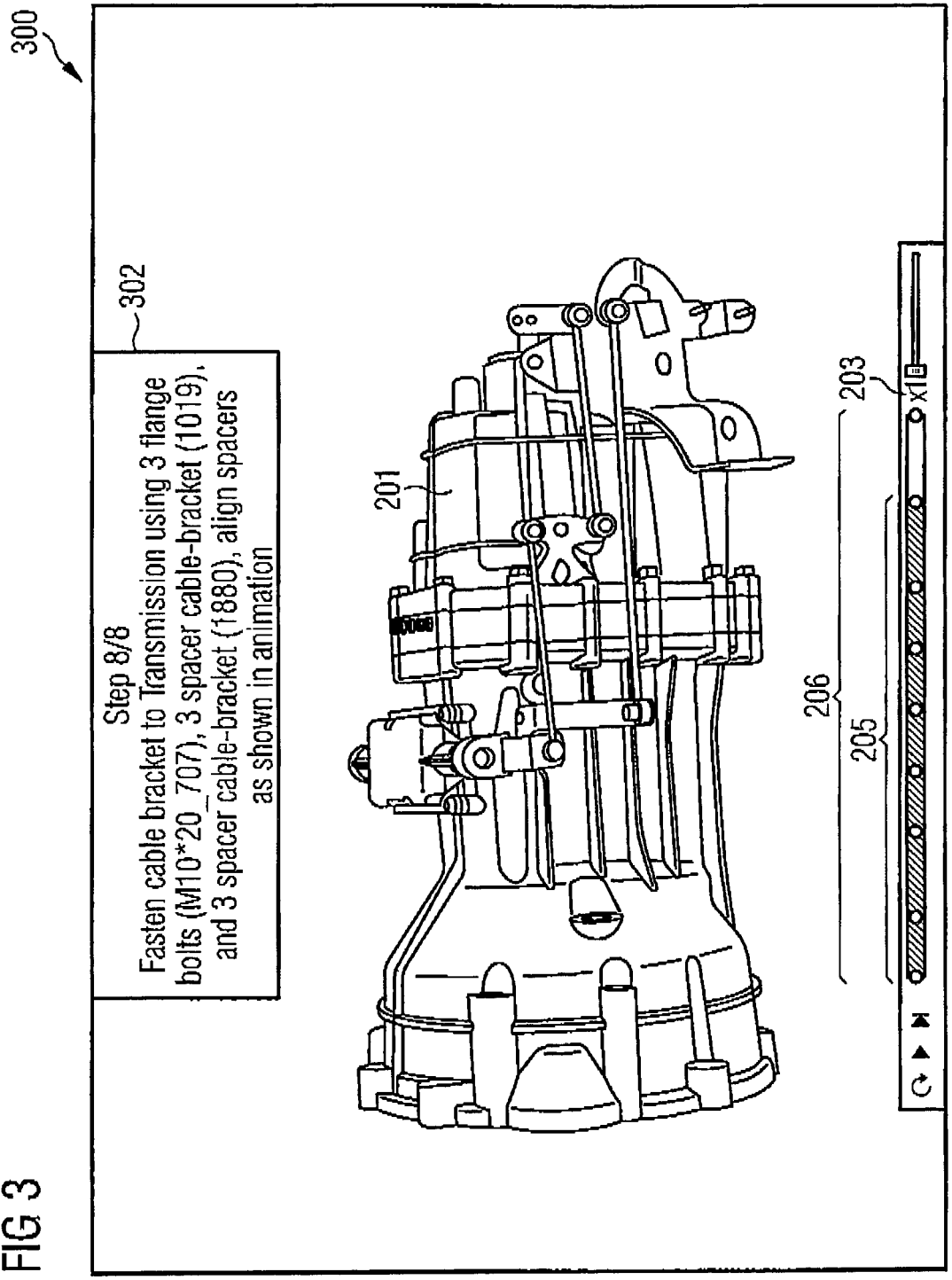

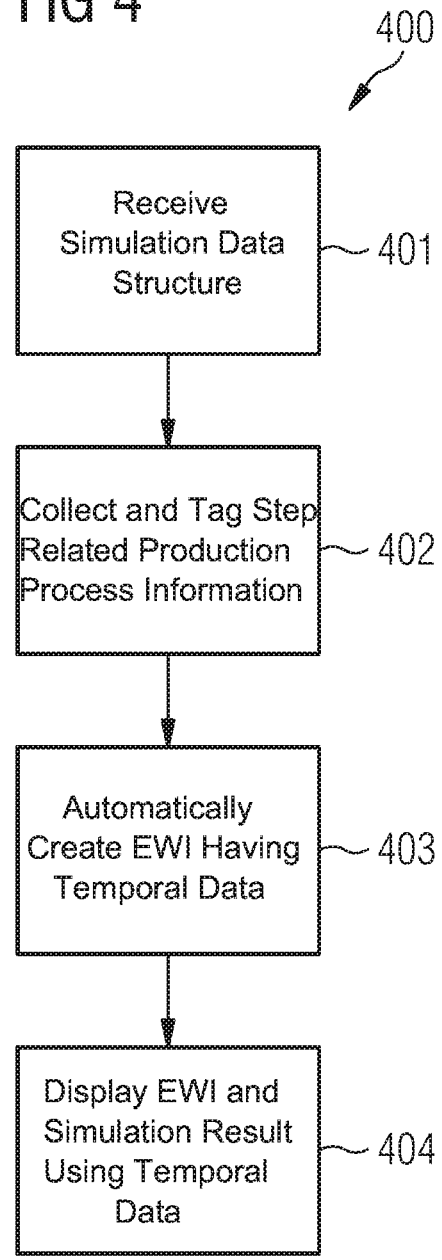

METHOD AND SYSTEM FOR AUTOMATIC WORK INSTRUCTION CREATION

BACKGROUND OF THE INVENTION

Field of the Invention

The present disclosure is directed, in general, to computer-aided design, visualization, and manufacturing ("CAD") systems, product lifecycle management ("PLM") systems, product data management ("PDM") systems, and similar systems, that manage data for products and other items (collectively, "Product Data Management" systems or PDM systems). More specifically, the disclosure is directed to production environment simulation.

In the planning of industrial processes, computer simulation techniques are used where a physical scene of a physical environment is modeled by a virtual scene of a virtual simulation environment. The physical or real scene may, for example, be a facility, a manufacturing plant, an industrial scene, or any other physical scene which may benefit from being modeled in a virtual environment for industrial simulation purposes.

The real scene may include a variety of real objects which are related to a manufacturing plant. Examples of real objects include, but are not limited to, equipment pieces, tools, containers, robots, material pieces, finished or semi-finished products, and other objects present in the real scene. Real objects are represented in the virtual simulation environment by virtual objects. Virtual objects are typically defined through three-dimensional (3D) virtual models, examples of which include, but are not limited to, CAD models, CAD-like models, point cloud models, and other types of 3D computer models.

In the real scene, the real objects are characterized by a position, an orientation, strain and stress, which can change/move as the real object is moving or re-positioned within the real scene. When modeling industrial facilities in the virtual simulation environment, it is often a common requirement that the position, orientation, strain and stress of the virtual objects in the virtual scene accurately reflect the position, orientation strain and stress of the real objects in the real scene.

Typical simulation software like Siemens TECNOMATIX can therefore be used for simulating assembly or disassembly processes, human operations and mechanical procedures of tools, devices, and robots. Nevertheless, industrial workshops then still require work instructions for operators who will execute the human operations, the assembly or disassembly of product parts, etc. The work instruction is a documentation, e.g. electronic or paper documentation, defining or specifying work tasks, for instance a verification of quality criteria. Indeed modern industrial processes often have specific requirements regarding production processes, which then need to be clearly defined for an operator by means of the work instruction. For instance, it can be related to:

a. Product variants: different components and/or producing processes might be used for an end-product creation with a same equipment;
b. Dynamic changes of component production processes, wherein production processes might use different tools and operating sequences according to plant conditions or might change in function of test and exploitation of an end-product;
c. Cost reduction for the production processes of a product;
d. Error reduction for the production processes of a product;
e. Test or verification of the product during its production;
f. Minimizing a production cycle time;
g. Defining ergonomic requirements for minimizing personnel error and increase efficiency of the operator;
h. Defining suitable components for a production process.

The complexity of production processes makes the creation and/or update of work instructions time-consuming.

An objective of the present invention is to propose a method and a system for automatically and efficiently creating work instructions for a production process.

SUMMARY OF THE INVENTION

Various disclosed embodiments include methods and corresponding systems and computer readable mediums for automatically creating work instructions for a production process. A method includes receiving a simulation data structure, wherein the simulation data structure enables a simulation of a production process of a product and comprises simulation data and production process information. The simulation data comprises a virtual model of the product and defines one or several production steps. The method further comprises automatically collecting, for each step of the production process, step related production process information and temporally tagging or indexing said production process information collected for each step in order to create, for each step and from the production process information, an electronic work instruction (hereafter called "EWI") comprising a temporal data, wherein said temporal data enables a temporal synchronization of a display of the EWI with a display of the simulation result. The method finally comprises using said temporal data for synchronously displaying the EWI and the simulation result. An EWI according to the invention typically comprises data that might be stored in a database, and which enable to display simultaneously a work instruction/information for a shop floor worker with respect to a production process for a product and a 3D model of said product, providing therefore shop floor workers with visual and animated instructions regarding tasks to be performed or information about the production process.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE SEVERAL VIEWS OF THE DRAWING

For a more complete understanding of the present disclosure, and the advantages thereof, reference is now made to the following descriptions taken in conjunction with the accompanying drawings, wherein like numbers designate like objects, and in which:

FIG. 3 schematically illustrates a synchronous display of an EWI and a simulation result of a product during the last step of a production process;

FIG. 4 illustrates a flowchart of a process for automatically creating an EWI according to the invention.

DETAILED DESCRIPTION OF THE INVENTION

FIGS. 1 through 4, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

As previously exposed, the creation of EWI is a laborious and complex work due to the numerous tasks that can be performed at the shop floor and the great variety of materials, tools, machines, processes. No straightforward method enables an automatic and easy creation of EWI for specific production processes.

Present embodiments cure the above-mentioned deficiencies by providing a simple method and system capable of automatically creating EWI for production processes of a product.

Figure 1:
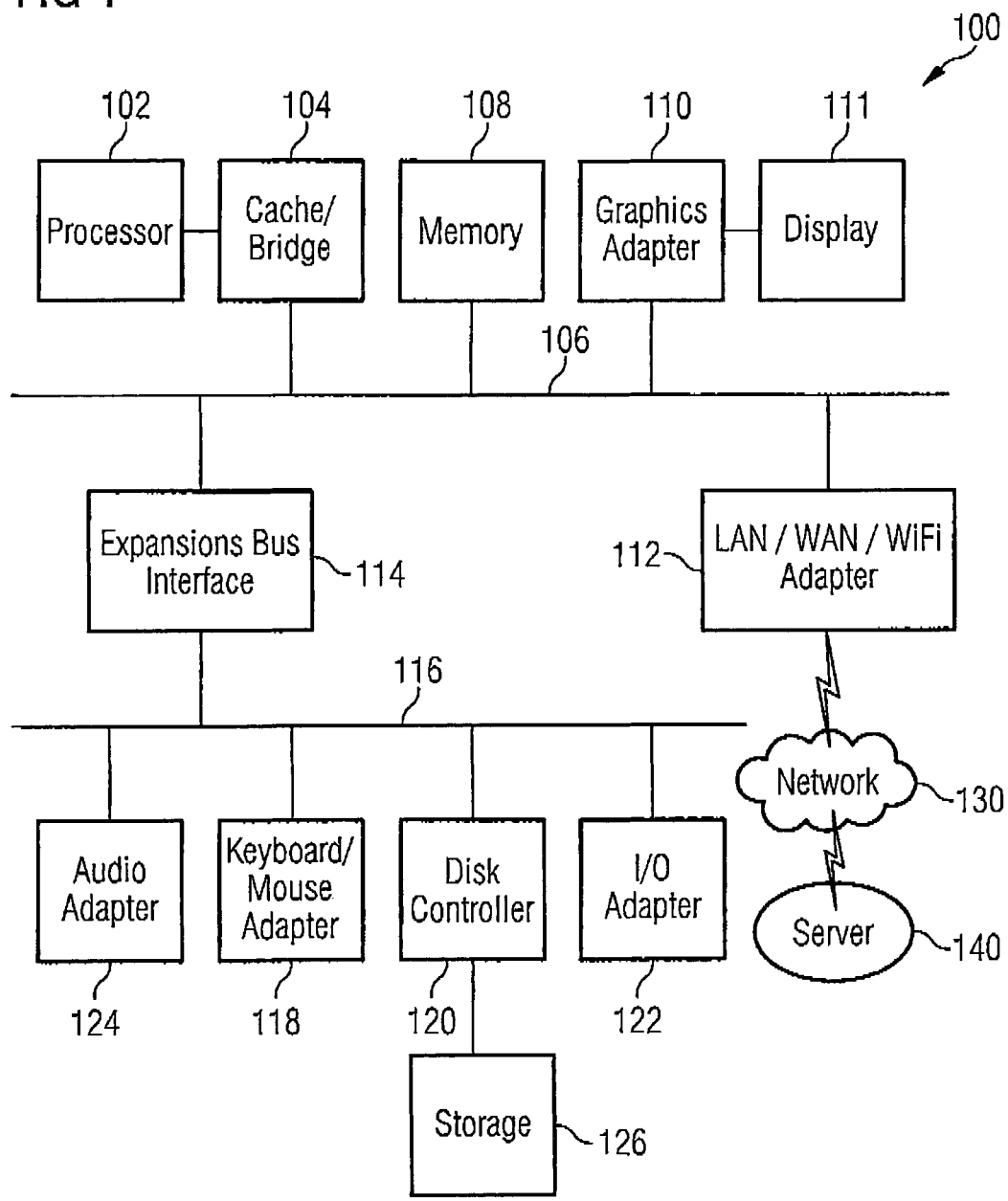
FIG. 1 illustrates a block diagram of a data processing system in which an embodiment can be implemented.

FIG. 1 illustrates a block diagram of a data processing system 100 in which an embodiment can be implemented, for example as a PDM system particularly configured by software or otherwise to perform the processes as described herein, and in particular as each one of a plurality of interconnected and communicating systems as described herein. The data processing system 100 illustrated can include a processor 102 connected to a level two cache/bridge 104, which is connected in turn to a local system bus 106. Local system bus 106 may be, for example, a peripheral component interconnect (PCI) architecture bus. Also connected to local system bus in the illustrated example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, touchscreen, etc.

Those of ordinary skill in the art will appreciate that the hardware illustrated in FIG. 1 may vary for particular implementations. For example, other peripheral devices, such as an optical disk drive and the like, also may be used in addition or in place of the hardware illustrated. The illustrated example is provided for the purpose of explanation only and is not meant to imply architectural limitations with respect to the present disclosure.

A data processing system in accordance with an embodiment of the present disclosure can include an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

Figure 2:
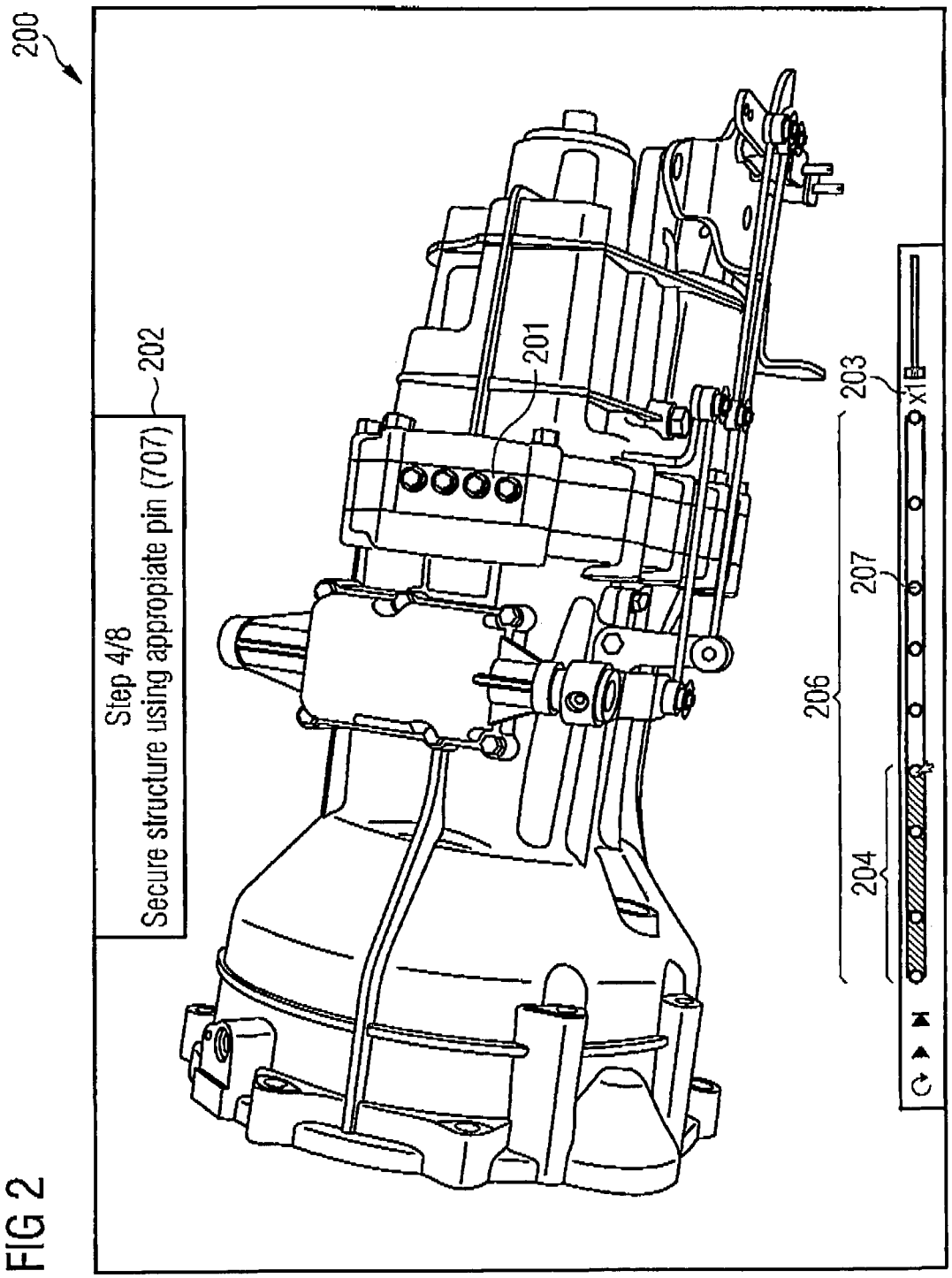
FIG. 2 schematically illustrates a synchronous display of an EWI and a simulation result of a product during a fourth step of a production process.

FIGS. 2 and 3 illustrate two different displays, respectively a first display 200 showing a fourth step of a production process of a product, and a second display 300 showing a last step of said production process of the product. For each display, an EWI 202, 302 providing work instructions or information regarding the on-going production process step is displayed simultaneously and together with a simulation result 201, typically a 3D model of the product or of parts to be assembled or disassembled, obtained by simulating the production process of the product using conventional simulating means. For each step, the simulation result 201 shows for instance dynamic operations performed on the product during the production process step. The simulation result 201 is a virtual representation (a graphic object) of the product during each production step, typically showing 3D graphical behavior of the product for instance during its assembly or its disassembly, wherein said virtual representation is obtained by running simulation software such as Siemens Tecnomatix®. The simulation result 201 is preferentially a dynamical result showing for instance operations realized on the product. The present invention enables to automatically generate the EWI 202, 302 displaying work instructions or information for the displayed, preferentially dynamically displayed, simulation result 201. In other words, the displays of the EWI 202, 302 and of the simulation result 201 during a chronological viewing of the whole production process of the product are synchronized. The EWI provide therefore an operator with timely accurate information or tasks regarding the on-going production process that is virtually represented by the simulation result 201. Preferentially, a time scale 203 shows the time needed for displaying the simulation result 201 for each production process step with regard to a total duration 206 needed for displaying the simulation results of the whole production process, i.e. all steps of the production process. The time scale 203 illustrated in FIG. 2 shows for instance the time past 204 since the start of the presentation of the simulation results until reaching the simulation result of the fourth production step and the time scale 203 presented in FIG. 3 shows the time past 205 since the start of the presentation of the simulation results until reaching the display of the simulation result of the last production process step. Preferentially, said time scale 203 comprises a cursor, wherein moving the cursor along the time scale enables an automatic display of the simulation result and corresponding EWI. In particular, said time scale 203 comprises markers, e.g. dots 2017, wherein each marker location within said time scale 203 indicates the begin of a new production process step. The sized (width) of said time scale 203 when displayed on a specific screen remains in particular constant, i.e. independent of the value of the total duration of the whole production process. In other words, said time scale 203 is preferentially normalized.

FIG. 4 illustrates a flowchart 400 of a method for automatically creating an EWI for a production process of a product. The method can be implemented by the data processing system of FIG. 1.

At step 401, the data processing system receives a simulation data structure. Said simulation data structure enables a simulation of a production process of a product and comprises simulation data and production process information. The simulation data comprises a virtual or numerical model (e.g. a 3D virtual model) of the product and defines one or several production process steps, wherein each production process step represents an operation to be performed on the product and that is simulated by means of the simulation data. The virtual model of the product typically includes components and parts that might be assembled or disassembled for producing said product. An operation of the production process step might be for instance assembling or disassembling some components or parts according to the production process. The production process information typically comprises information regarding components and/or parts and/or tools and/or tasks and/or operations that are involved in the production process step. The production process information might be stored in the form of comments within a memory of a data processing system.

At step 402, the data processing system automatically collects, for each step of the production process, step related production process information and temporally tags or indexes the collected step related production process information with respect to a simulation of the production process, for instance by attributing a temporal data to each step related production process information that has been collected. Preferentially, the collected step related production process information is stored by the data processing system in a data structure which is preferably divided per production process step and stored by chronological order according to a simulation time of the production process. In particular, tagging or indexing the collected step related production process information comprises determining by the data processing system an attribute for each entry of the data structure, wherein the attribute refers to the simulation time at which a relevant operation within the production process begins, like the simulation time at which the production process step starts. Optionally, the data processing system determines, notably from said attribute, a duration of a simulation of at least one, preferentially each, production process step. For instance, the simulation data are used for determining said duration.

At step 403, the data processing system is configured for automatically creating EWI comprising a temporal data from the collected and tagged step related production process information. For instance, the temporal tagging of the production process information, notably the determination of the attribute for each entry in the data structure, might be automatically realized by the data processing system by temporally correlating a simulation result of the production process of said product as obtained from the simulation data for said production step with the step related production process information in order to automatically create, from said step related production process information, the EWI comprising the temporal data. Advantageously, said temporal data of the EWI enables a temporal synchronization of a display of the EWI with a display of the simulation result, said temporal data being for instance the temporal data attributed to the step related production process information or generated/created from said temporal tagging/indexing of the step related production process. Preferentially, said temporal data is the attribute determined by the data processing system for each entry of the data structure.

At step 404, the data processing system is preferably configured for automatically using the temporal data of the previously created EWI for displaying simultaneously or synchronously the EWI and the simulation result. Optionally, the data processing system is further configured for displaying for each production step and in addition to the EWI, the time scale showing a chronological succession of the production process steps, wherein each step is characterized by said duration with respect to durations of other production process steps for said product.

According to prior art, the kinematic simulation of the production process from the available simulation data only provides the visual behavior of the product, for instance a 3D object as shown by means of reference 201 in FIGS. 2 and 3. The present invention is capable to collect and decrypt production process information and to format it into EWI for each step of the production process. Advantageously, the present invention is able to correlate the result of a simulation and the EWI. This correlation enables a synchronization between the EWI and the simulation result which helps shop floor workers to perform their production task.

Preferentially, after correlating the simulation result and the corresponding production process information, the data processing system is configured for generating a set of files, containing not only complete information about the behavior of the graphic object resulting from the simulation of the production process step, but also EWI which comprises synchronous information with respect to the graphic object. The synchronization of the EWI and the simulation result, i.e. the graphic object that results from the simulation of the production process step, is notably realized by time tagging each EWI with respect to the production process step, for instance by means of the temporal data or attribute, so that a kinematic of the graphic object and the EWI are synchronizable. Consequently, loading said generated set of files comprising the simulation result and the EWI to a viewer enables the synchronous display of the EWI and the simulation result as shown in FIGS. 2 and 3.

In order to realize the present invention, one or more of the processor 102, the memory 108, and the program running on the processor 102 receive the simulation data structure via one or more of the local system bus 106, the adapter 112, the network 130, the server 140, the interface 114, the I/O bus 116, the disk controller 120, the storage 126, and so on. Receiving, as used herein, can include retrieving from storage 126, receiving from another device or process, receiving via an interaction with a user, or otherwise.

Of course, those of skill in the art will recognize that, unless specifically indicated or required by the sequence of operations, certain steps in the processes described above may be omitted, performed concurrently or sequentially, or performed in a different order.

Those skilled in the art will recognize that, for simplicity and clarity, the full structure and operation of all data processing systems suitable for use with the present disclosure is not being illustrated or described herein. Instead, only so much of a data processing system as is unique to the present disclosure or necessary for an understanding of the present disclosure is illustrated and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims.

What is claimed is:

1. A method for automatically creating work instructions for a production process, the method comprising:
    a) receiving a simulation data structure, the simulation data structure enabling a simulation of a production process of a product and the simulation data structure including:
        simulation data including a virtual model of the product and defining one or several production process steps, each production process step including an operation to be performed on the product being simulated by the simulation data; and
        production process information;
    b) automatically collecting, for each step of the production process, step related production process information, and temporally tagging the step related production process information with respect to the simulation of the production process step to create from the collected step related production process information an electronic work instruction including temporal data enabling a temporal synchronization of a display of the electronic work instruction with a display of the simulation result; and
    c) for each production step, using the temporal data for synchronously displaying the electronic work instruction and the simulation result and a time scale showing a chronological succession of each step, a temporal width of the time scale when displayed on a specific screen being independent of a value of a total duration of an entirety of the production process, and each step being characterized by a duration defined with respect to durations of other production process steps for the product.

2. The method according to claim 1, which further comprises assembling components or parts of the product in the production process step.

3. The method according to claim 2, which further comprises disassembling components or parts of the product in the production process step.

4. The method according to claim 1, which further comprises determining the temporal data from temporal tagging or indexing of the collected step related production process information.

5. The method according to claim 1, which further comprises carrying out the temporal tagging of the step related production process information with respect to the simulation of the production process step, for each production process step, by automatically correlating a simulation result of the production process of the product as obtained from the simulation data for the production process step with the collected step related production process information to determine the temporal data for the electronic work instruction.

6. The method according to claim 1, which further comprises storing the collected step related production process information in a data structure divided per production process step and stored by chronological order according to a simulation time of the production process.

7. A data processing system, comprising:
    a processor; and
    an accessible memory;
    the data processing system configured to:

a) receive a simulation data structure, the simulation data structure configured for enabling a simulation of a production process of a product and the simulation data structure including:
   simulation data including a virtual model of the product and defining one or several production process steps, each production process step representing an operation to be performed on the product to be simulated by the simulation data; and
   production process information;
b) automatically collect, for each step of the production process, step related production process information, and temporally tag the step related production process information with respect to the simulation of the production process step to create from the collected step related production process information an electronic work instruction, including temporal data enabling a temporal synchronization of a display of the electronic work instruction with a display of the simulation result; and
c) for each step of the production process, the data processing system being configured for using the temporal data to synchronously display the electronic work instruction and the simulation result and a time scale showing a chronological succession of each step, a temporal width of the time scale when displayed on a specific screen being independent of a value of a total duration of an entirety of the production process, and each step being characterized by a duration defined with respect to durations of other production process steps for the product.

8. The data processing system according to claim 7, wherein the data processing system is configured to automatically correlate a simulation result of the production process of the product as obtained from the simulation data for the production process step with the collected step related production process information to determine the temporal data for the electronic work instruction.

9. The data processing system according to claim 7, wherein the data processing system is configured for storing the collected step related production process information in a data structure divided per production process step and stored by chronological order according to a simulation time of the production process.

10. A non-transitory computer-readable medium encoded with executable instructions that, when executed, cause one or more data processing systems to:
   a) receive a simulation data structure, the simulation data structure configured for enabling a simulation of a production process of a product and the simulation data structure including:
      simulation data including a virtual model of the product and defining one or several production process steps, each production process step representing an operation to be performed on the product to be simulated by the simulation data; and
      production process information;
   b) automatically collect, for each step of the production process, step related production process information, and temporally tag the step related production process information with respect to the simulation of the production process step to create from the collected step related production process information an electronic work instruction, including temporal data enabling a temporal synchronization of a display of the electronic work instruction with a display of the simulation result; and
   c) for each step of the production process, the data processing system being configured for using the temporal data to synchronously display the electronic work instruction and the simulation result and a time scale showing a chronological succession of each step, a temporal width of the time scale when displayed on a specific screen being independent of a value of a total duration of an entirety of the production process, and each step being characterized by a duration defined with respect to durations of other production process steps for the product.

11. The non-transitory computer-readable medium according to claim 10, wherein the data processing system is configured to automatically correlate a simulation result of the production process of the product as obtained from the simulation data for the production process step with the collected step related production process information to determine the temporal data for the electronic work instruction.

* * * * *